United States Patent
Anderson et al.

(10) Patent No.: US 9,286,425 B2
(45) Date of Patent: Mar. 15, 2016

(54) METHOD, STRUCTURE AND DESIGN STRUCTURE FOR CUSTOMIZING HISTORY EFFECTS OF SOI CIRCUITS

(71) Applicant: INTERNATIONAL BUSINESS MACHINES CORPORATION, Armonk, NY (US)

(72) Inventors: Brent A. Anderson, Jericho, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 259 days.

(21) Appl. No.: 13/747,798

(22) Filed: Jan. 23, 2013

(65) Prior Publication Data

US 2013/0132924 A1    May 23, 2013

Related U.S. Application Data

(63) Continuation of application No. 12/055,622, filed on Mar. 26, 2008, now Pat. No. 8,410,554.

(51) Int. Cl.
*H01L 21/8238* (2006.01)
*G06F 17/50* (2006.01)
*H01L 21/762* (2006.01)
*H01L 21/84* (2006.01)
*H01L 27/12* (2006.01)

(52) U.S. Cl.
CPC ...... *G06F 17/5045* (2013.01); *H01L 21/76229* (2013.01); *H01L 21/84* (2013.01); *H01L 27/1203* (2013.01)

(58) Field of Classification Search
CPC ............ H01L 21/823878; H01L 29/1037; H01L 21/76229; H01L 21/76283
USPC ............................................ 438/218
See application file for complete search history.

(56) References Cited

U.S. PATENT DOCUMENTS

| | | |
|---|---|---|
| 4,416,405 A | 11/1983 | Caillouet |
| 5,536,950 A | 7/1996 | Liu et al. |
| 5,747,353 A | 5/1998 | Bashir et al. |
| 5,777,362 A | 7/1998 | Pearce |

(Continued)

FOREIGN PATENT DOCUMENTS

JP    2004-207517    7/2004

OTHER PUBLICATIONS

Ch. Hollauer: Modeling of Thermal Oxidation and Stress Effects.*

(Continued)

*Primary Examiner* — Jay C Kim
*Assistant Examiner* — David Chen
(74) *Attorney, Agent, or Firm* — Anthony Canale; Andrew M. Calderon; Roberts Mlotkowski Safran & Cole, P.C.

(57) ABSTRACT

A design structure is embodied in a machine readable medium for designing, manufacturing, or testing a design. The design structure includes a structure which comprises a high-leakage dielectric formed in a divot on each side of a segmented FET comprised of active silicon islands and gate electrodes thereon, and a low-leakage dielectric on the surface of the active silicon islands, adjacent the high-leakage dielectric, wherein the low-leakage dielectric has a lower leakage than the high-leakage dielectric. Also provided is a structure and method of fabricating the structure.

13 Claims, 6 Drawing Sheets

(56) References Cited

U.S. PATENT DOCUMENTS

| | | | |
|---|---|---|---|
| 5,844,285 | A | 12/1998 | Kwon |
| 5,962,895 | A | 10/1999 | Beyer et al. |
| 6,124,189 | A | 9/2000 | Watanabe et al. |
| 6,124,613 | A | 9/2000 | Kokubum |
| 6,156,589 | A | 12/2000 | Noble |
| 6,268,630 | B1 | 7/2001 | Schwank et al. |
| 6,300,657 | B1 | 10/2001 | Bryant et al. |
| 6,307,237 | B1 | 10/2001 | Erstad |
| 6,406,945 | B1 | 6/2002 | Lee et al. |
| 6,429,477 | B1 | 8/2002 | Mandelman et al. |
| 6,429,487 | B1 | 8/2002 | Kunikiyo |
| 6,488,618 | B1 | 12/2002 | Paolitto et al. |
| 6,492,695 | B2 | 12/2002 | Lutze |
| 6,498,371 | B1 | 12/2002 | Krishnan et al. |
| 6,506,654 | B1 | 1/2003 | Wei et al. |
| 6,514,808 | B1 | 2/2003 | Samavedam et al. |
| 6,550,651 | B1 | 4/2003 | Murdoch et al. |
| 6,624,459 | B1 | 9/2003 | Dachtera et al. |
| 6,627,511 | B1 | 9/2003 | Racanelli et al. |
| 6,630,376 | B1 | 10/2003 | Krishnan et al. |
| 6,633,067 | B2 | 10/2003 | Noble |
| 6,642,579 | B2 | 11/2003 | Fung |
| 6,666,545 | B2 | 12/2003 | Liu et al. |
| 6,670,675 | B2 | 12/2003 | Ho et al. |
| 6,677,645 | B2 | 1/2004 | Bryant et al. |
| 6,724,048 | B2 | 4/2004 | Min et al. |
| 6,740,551 | B2 | 5/2004 | Yoshida et al. |
| 6,784,101 | B1 | 8/2004 | Yu et al. |
| 6,815,282 | B2 | 11/2004 | Dachtera et al. |
| 6,868,000 | B2 | 3/2005 | Chan et al. |
| 6,907,584 | B1 * | 6/2005 | Milne et al. ............... 716/102 |
| 6,911,010 | B2 | 6/2005 | Dirks et al. |
| 6,939,752 | B1 | 9/2005 | Liu et al. |
| 6,940,130 | B2 | 9/2005 | Bryant et al. |
| 6,953,738 | B2 | 10/2005 | Veeraraghavan et al. |
| 6,960,810 | B2 | 11/2005 | Fechner |
| 6,974,998 | B1 | 12/2005 | Liu et al. |
| 6,992,358 | B2 | 1/2006 | Hieda et al. |
| 7,033,895 | B2 | 4/2006 | Lee et al. |
| 7,078,773 | B2 | 7/2006 | Chan et al. |
| 7,192,816 | B2 | 3/2007 | Fechner |
| 7,244,640 | B2 | 7/2007 | Yang et al. |
| 7,269,860 | B2 | 9/2007 | Dennis et al. |
| 7,273,794 | B2 | 9/2007 | Hakey et al. |
| 7,348,247 | B2 | 3/2008 | Park |
| 7,632,745 | B2 | 12/2009 | Chen |
| 2002/0011612 | A1 | 1/2002 | Hieda |
| 2002/0022360 | A1 | 2/2002 | Kim et al. |
| 2002/0040998 | A1 | 4/2002 | Lee |
| 2002/0045296 | A1 | 4/2002 | Yagishita et al. |
| 2002/0100947 | A1 | 8/2002 | Lee et al. |
| 2002/0160581 | A1 * | 10/2002 | Watanabe ....... H01L 21/823481 438/430 |
| 2003/0020120 | A1 * | 1/2003 | Ye .................. H01L 21/823814 257/377 |
| 2003/0084413 | A1 * | 5/2003 | Varney .............................. 716/4 |
| 2004/0067619 | A1 | 4/2004 | Niimi et al. |
| 2004/0155317 | A1 | 8/2004 | Bhattacharyya |
| 2005/0017377 | A1 * | 1/2005 | Joshi ....................... H01L 21/84 257/368 |
| 2005/0018380 | A1 | 1/2005 | Yeo et al. |
| 2005/0023633 | A1 | 2/2005 | Yeo et al. |
| 2005/0085042 | A1 * | 4/2005 | Chun ................ H01L 21/76229 438/275 |
| 2005/0121703 | A1 | 6/2005 | Hieda et al. |
| 2005/0269600 | A1 * | 12/2005 | Kakoschke ............. H01L 21/84 257/213 |
| 2005/0269634 | A1 | 12/2005 | Bojarczuk et al. |
| 2005/0269635 | A1 | 12/2005 | Bojarczuk et al. |
| 2005/0269648 | A1 | 12/2005 | Basceri et al. |
| 2007/0063277 | A1 | 3/2007 | Belyansky et al. |
| 2007/0189076 | A1 | 8/2007 | Abadeer et al. |
| 2007/0290223 | A1 * | 12/2007 | Yagishita ...................... 257/103 |
| 2008/0064194 | A1 | 3/2008 | Hong |
| 2008/0068889 | A1 | 3/2008 | Wu |
| 2009/0242985 | A1 | 10/2009 | Anderson et al. |
| 2009/0243000 | A1 | 10/2009 | Anderson et al. |
| 2009/0243029 | A1 | 10/2009 | Anderson et al. |

OTHER PUBLICATIONS

Schwartz et al., "Handbook of Semiconductor Interconnection Technology", Taylor and Francis Group, LLC., Second Edition, 2006, pp. 171 and 256.

Hollauer, "Modeling of Thermal Oxidation and Stress Effects", 2.4 Oxidation Parameters, 2007, (8 pages).

Colombo et al., "GateDielectric Process Technology for the Sub-1 nm Equivalent Oxide Thickness (EOT) Era", The Electrochemical Society Interface, Fall 2007, pp. 51-55.

Chen et al., "High-Performance Polycrystalline Silicon Thin-Film Transistors with Oxide-Nitride-Oxide Gate Dielectric and Multiple Nanowire Channels", Elsevier Science Direct, This Solid Films, Sep. 20, 2006, pp. 1112-1116.

Office Action dated Feb. 11, 2014 for U.S. Appl. No. 13/793,185; 17 pages.

Office Action dated Jul. 10, 2014 for U.S. Appl. No. 13/793,185; 17 pages.

Notice of Allowance dated Oct. 16, 2014 in U.S. Appl. No. 13/793,185; 11 pages.

Office Action dated Jul. 21, 2015 in U.S. Appl. No. 14/520,445, 21 pages.

Final Office Action dated Nov. 24, 2015 in related U.S. Appl. No. 14/520,445, 18 Pages.

* cited by examiner

METHOD, STRUCTURE AND DESIGN STRUCTURE FOR CUSTOMIZING HISTORY EFFECTS OF SOI CIRCUITS

FIELD OF THE INVENTION

The present invention generally relates to a structure for customizing history effects of a transistor, a design structure and method of manufacture, and more particularly, to a structure selectively using a high-leakage dielectric to customize for leakage history effects of a circuit, a design structure for customizing leakage history effects of a circuit and a method of manufacturing such structure.

BACKGROUND OF THE INVENTION

History effect in SOI circuits can lead to less-than-optimal delay-vs.-power circuits due to elevated stimulated leakage and worst-case-history timing for applications. More specifically, Partially-Depleted Silicon On Insulator (PDSOI) technology features a "floating body" which can be described as a region of silicon beneath the FET channel which is undepleted of its equilibrium carrier concentration, and is largely electrically neutral. This floating body will vary in electric potential (voltage) with use of the transistor.

There are two types of effects that determine the body potential, namely leakage sources, which are static in nature, and capacitive coupling, which is intrinsically transient in its influence on body voltage. The two effects taken with the recent electrical states of a PDSOI FET determine the body voltage.

As the body voltage varies, the FET threshold-voltage (Vt), and hence, the drive currents are influenced. The final outcome of such variations is that the detailed performance of a circuit employing PDSOI will be a function of the most-recent history of use of the circuit. For example, if the circuit has been inactive for some time greater than the relaxation times of the FETs, then the performance will be characteristic of that obtained with body voltages at equilibrium. This is the so-called first-switch state.

By contrast, if the same circuit is stimulated a short-time after the "first-switch" event (i.e., a time significantly less than the relaxation times of the FET body voltage), the body voltages will have been perturbed from the equilibrium values by capacitive coupling from source, drain, and gate, to the body. This will result in a different set of body voltages and, hence, a different, "second-switch," performance will be characteristic of the circuit.

Using the first and second switch events, the history can be defined as:

$$\text{History} = [T1 - T2] / [(\tfrac{1}{2})*(T1+T2)]$$

where T1=1st switch delay and T2=2nd switch delay. And, the gate-to-body leakage can affect history in two ways:

1. For T1, the load device has its 1st-switch Vt lowered (closer to zero) which causes the load FET to buck the transition more effectively and hence increase the value of T1; and
2. In the second switch, the body of the load device is unaffected, while the active device now has a more forward-biased body, and hence is faster. Thus the second switch becomes faster with increasing gate-to-body leakage, so the net is that history becomes more positive.

However, to minimize variability, and to maximize switching speed per unit power, it is desirable to minimize history, i.e. History=0. To do this, current technology optimizes the circuit by minimizing history, averaged over typical use conditions. But differing history behavior by circuit topology (e.g., inverter, vs. nand, nor, pass-gate, etc.) has left a wide range of history-effect within a real product.

Accordingly, there exists a need in the art to overcome the deficiencies and limitations described hereinabove.

SUMMARY OF THE INVENTION

In a first aspect of the invention, a structure comprises a high-leakage dielectric formed in a divot on each side of a segmented FET comprised of active silicon islands and gate electrodes thereon, and a low-leakage dielectric on the surface of the active silicon islands, adjacent the high-leakage dielectric. The low-leakage dielectric has a lower leakage than the high-leakage dielectric.

In an additional aspect of the invention, a method comprises forming a low-leakage dielectric on a surface of a segmented FET comprised of active silicon islands and gate electrodes formed thereon. The method further comprises forming a high-leakage dielectric in a portion of a divot formed in a shallow isolation material adjacent to and in contact with each side of the segmented FET.

In a further aspect of the invention, a design structure for adjusting and/or customizing history effects of a circuit is embodied in a machine readable medium for designing, manufacturing, or testing an integrated circuit. The design structure comprises a high-leakage dielectric formed in a divot on each side of a segmented FET comprised of active silicon islands and gate electrodes thereon, and a low-leakage dielectric on the surface of the active silicon islands, adjacent the high-leakage dielectric. The low-leakage dielectric has a lower leakage than the high-leakage dielectric.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a structure for customizing history effects of a transistor, a design structure and method of manufacture. More specifically, the present invention is directed to a structure using a high-leakage dielectric, typically comprising a lower-k dielectric, to customize for leakage history effects of a circuit, a design structure for customizing leakage history effects of a circuit and a method of manufacturing such structure. By implementing the invention, it is possible to enable design-modified gate-to-body leakage, which is known to alter history effect. More specifically, the present invention provides the ability to adjust (customize) the history effects of a circuit in order to tailor individual circuits, and to the use of the circuits to provide benefits by reducing variability and delay of the circuit. In this way, it is possible to obtain both the best performance (e.g., smallest circuit delay) and the least variability of delay in CMOS circuits.

Structure and Fabrication Processes

Figure 1:
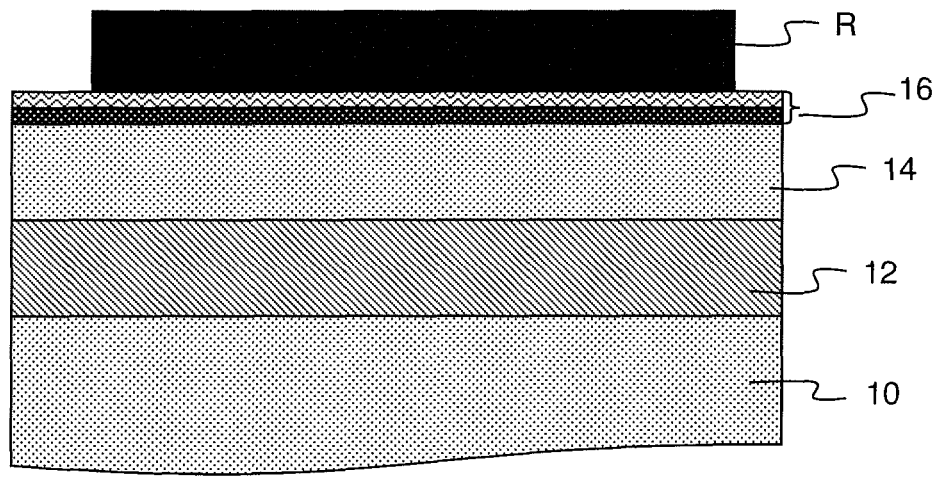
FIGS. 1-9 represent structures and processes for fabricating a device in accordance with the invention.

FIG. 1 represents a beginning structure and processes for fabricating the structure in accordance with the invention. More specifically, FIG. 1 shows a conventional BOX layer 12 formed on a silicon layer 10. An active silicon layer 14 is formed on the BOX layer 12 to form a conventional wafer. In non-limiting illustrative embodiments, the BOX layer 12 is between about 100 to 1000 nanometers. As should be understood by those of skill in the art, the active silicon layer 14 will be employed to form a segmented floating body FET.

Still referring to FIG. 1, pad layers 16 are formed on the active silicon layer 14. The pad layers 16, in embodiments, include a nitride layer formed on an oxide layer. For example, the wafer is subject to an oxidation process, which forms a silicon dioxide ($SiO_2$) layer (pad film). The $SiO_2$ layer can range in thickness depending on its application. More specifically, in one illustrative non-limiting example, the $SiO_2$ layer can range in thickness from about 100 Å to 600 Å. A Silicon Nitride ($Si_3N_4$) layer (pad film) is deposited on the $SiO_2$ layer in a conventional deposition process. The $Si_3N_4$ layer is preferably $Si_3N_4$ with a thickness of about 200 Å to 1200 Å; although, other thicknesses are also contemplated by the invention. A resist R is formed on the upper pad layer, e.g., nitride.

Figure 2:
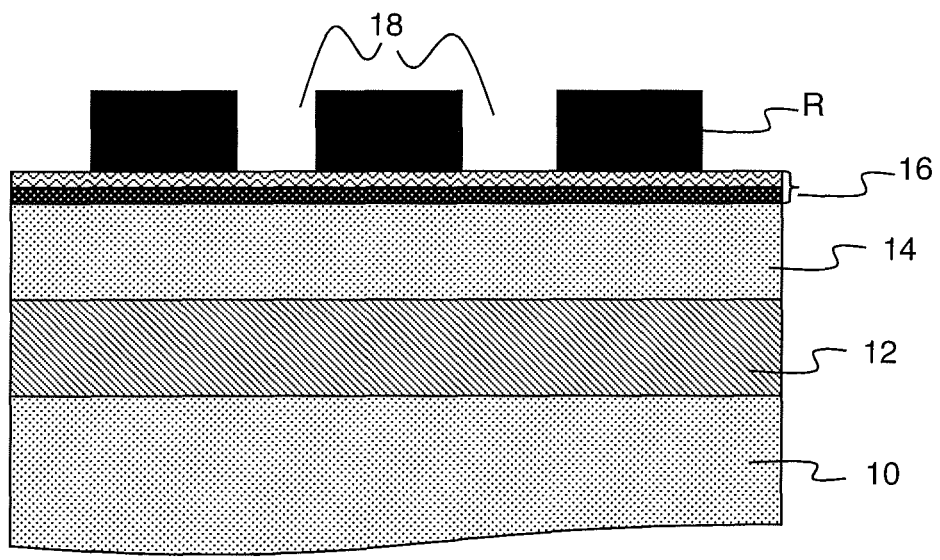

As shown in FIG. 2, the resist R is selectively patterned using conventional lithography processes. In embodiments, the resist R is patterned by, for example, exposing the resist R to a light source followed by selective chemical removal. In this example, a mask material (not shown) may be deposited over the resist R at selective portions. In the illustrative example of FIG. 2, the resist R is patterned to form holes 18 to expose the underlying pad layers 16. These holes will be used to form three silicon islands in subsequent etching steps. It should be understood by those of skill in the art that two or more silicon islands can be formed in the manner described herein.

Figure 3:
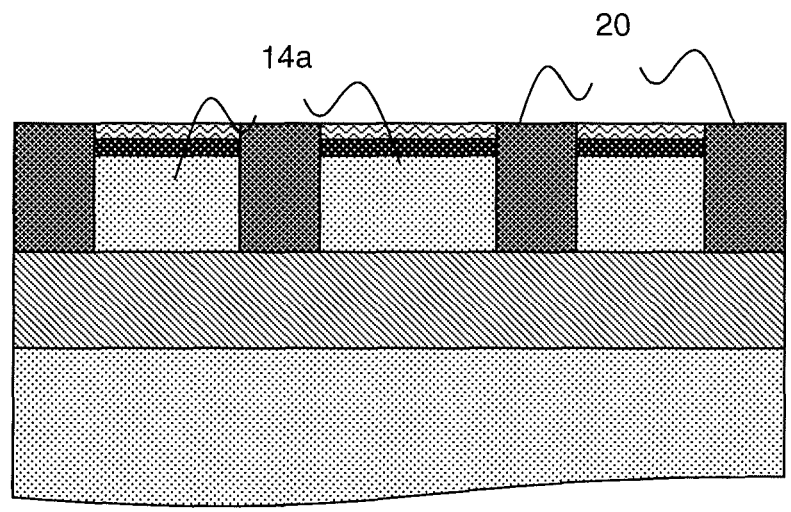

As shown in FIG. 3, once the resist R is patterned, shallow trench isolation structures 20 and active silicon islands 14a can be formed using conventional processes. For example, after the photoresist R is selectively patterned to form the holes 18, openings are etched into the pad layers 16 and the active silicon layer 14 to form a shallow trench. More specifically, using conventional etching processes such as, for example, Reactive Ion Etching (RIE), trenches can be formed through the structure to the BOX layer 12. The remaining active silicon will form active silicon islands 14a. (The active silicon layer 14 will be segmented, which will later be formed into a segmented FET.) After removing the remaining resist pattern, the trenches are filled with silicon dioxide to form shallow trench isolation (STI) structures 20. The silicon dioxide can be planarized to the nitride layer. This forms a nearly planar top surface of the structure. The STI structures 20 will isolate the active regions of the silicon layer 14, resulting in the structure of FIG. 3, e.g., active silicon islands 14a.

Figure 4:
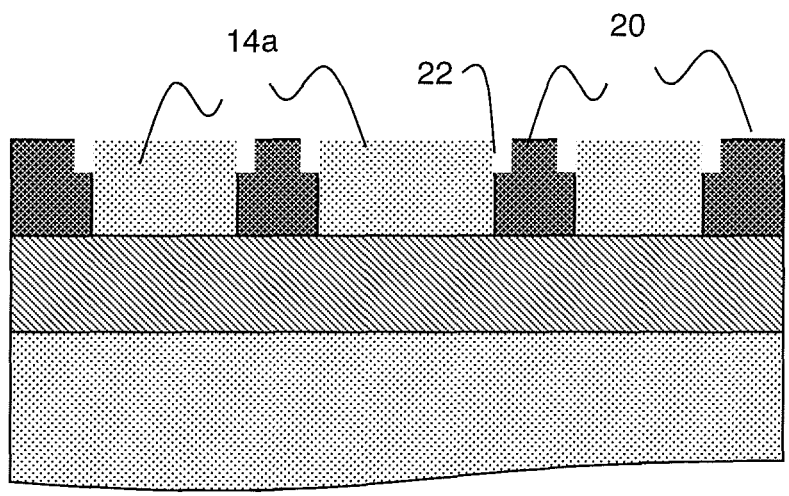

FIG. 4 shows further processing where the pad films 16 are removed from the structure of FIG. 3. The removal of the pad films 16 also incidentally removes portions of the silicon dioxide within the STI structures. The removal of portions of the silicon dioxide form divots 22 near the active silicon islands 14a.

Figure 5:
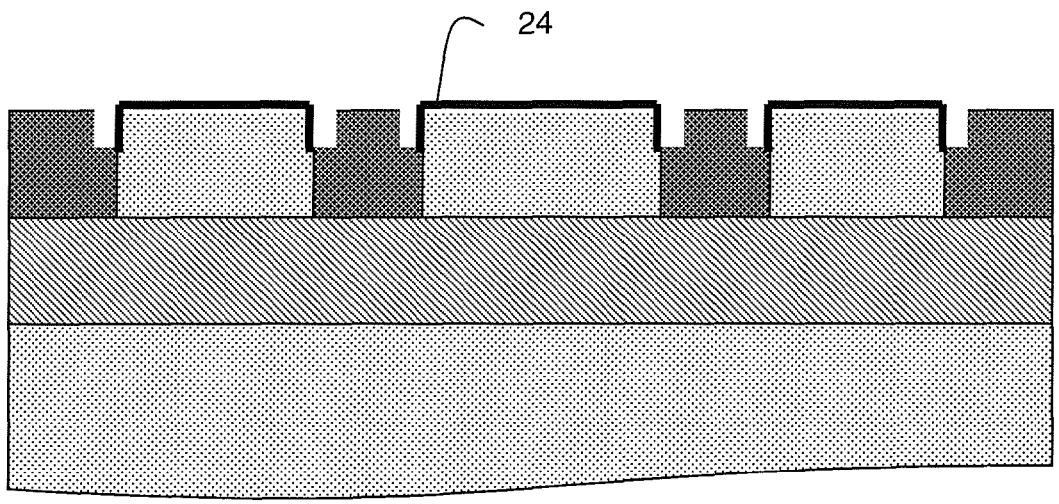

In FIG. 5, a high-leakage dielectric material 24 is grown on the exposed active silicon islands 14a. In embodiments, the high-leakage dielectric material 24 is silicon dioxide or a silicon oxynitride and more specifically $SiO_2$—SiO—N. In embodiments, the high-leakage dielectric material 24 is grown to a thickness of approximately 0.7 to 2 nanometers.

As should be understood by those of skill in the art, the high-leakage dielectric material 24 selectively grows on silicon and, hence, is formed in the divots 22 adjacent to and abutting the active silicon islands 14a.

Figure 6:
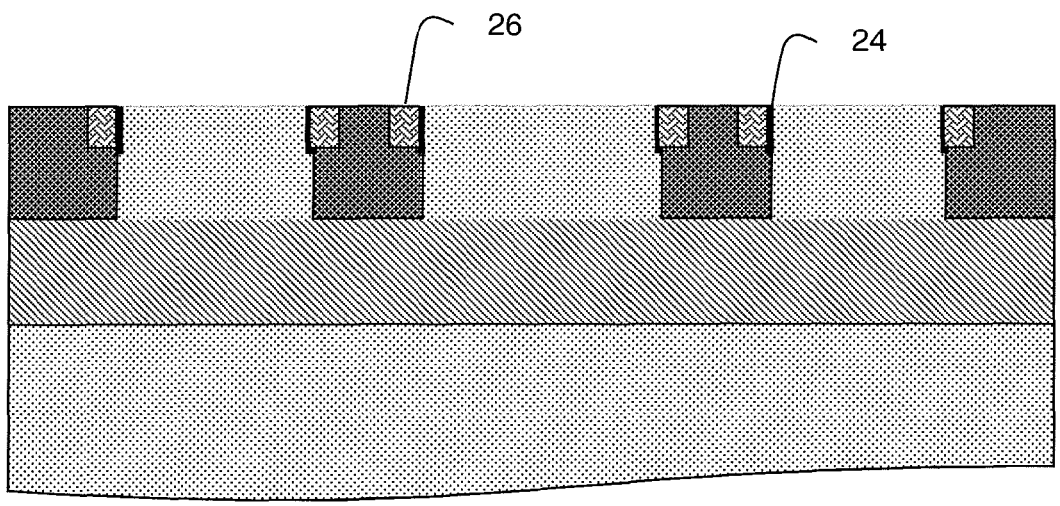

FIG. 6 shows a conventional deposition and planarizing process. More specifically, a gate electrode material 26 is deposited on the structure of FIG. 15, including within the divots 22. After the deposition of the gate electrode material 26, the structure of FIG. 6 is planarized and the exposed portion of the high-leakage dielectric material 24 is removed from the tops of each of the active silicon islands 14a. This leaves the high-leakage dielectric material 24 within the divots, between the gate electrode material 26 and a side of the active silicon islands 14a.

Figure 7:
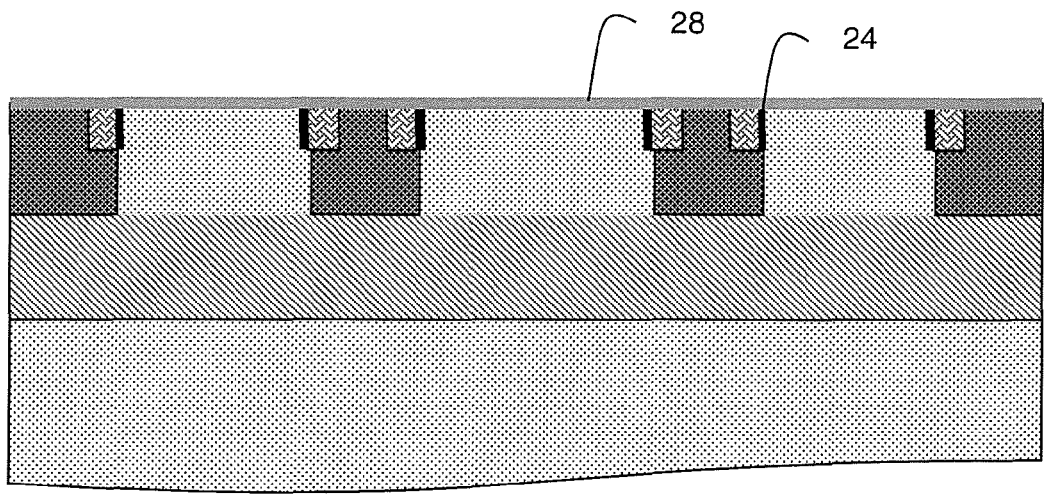

As shown in FIG. 7, a low-leakage dielectric 28 is blanket deposited over the structure of FIG. 6. In embodiments, the low-leakage dielectric 28 is a high-k material such as, for example, $HfO_2$ or $HfSiO_4$. In embodiments, the low-leakage dielectric 28 is about 1.5 nm to 10 nm and more preferably about 2 to 5 nm in thickness.

Figure 8:
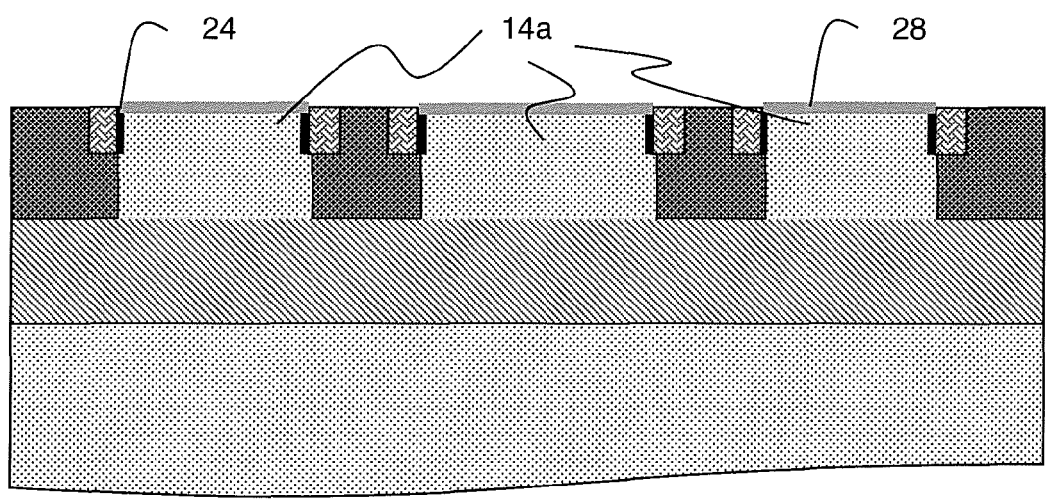

In FIG. 8, the low-leakage dielectric 28 is patterned on the active silicon islands 14a. More specifically, the low leakage dielectric 28 is patterned in a conventional manner, e.g., lithography and etching processes, to extend over the active silicon islands 14a. In embodiments, the low leakage dielectric 28 can overlap with the high-leakage dielectric 24. Also, the present invention contemplates adjusting the ratio of high-leakage dielectric 24 to the low-leakage dielectric 28 so as to customize the history effect of the device.

Figure 9:
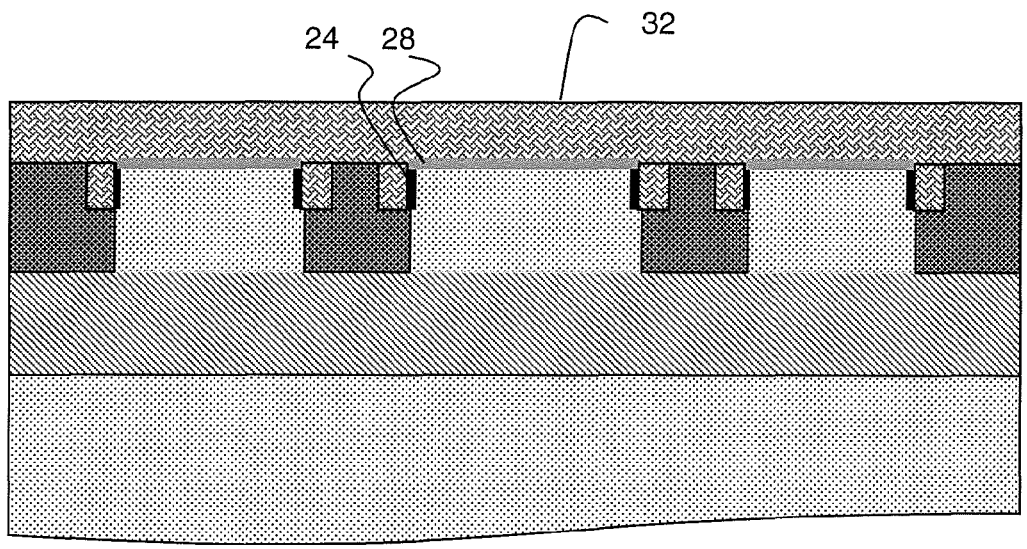

As shown in FIG. 9, a gate electrode material 32 is deposited over the structure of FIG. 8 using known deposition processes, e.g., conventional CVD, or ALD process. The gate electrode material 32 may be any conventional gate electrode material such as, for example, a doped polysilicon material. In still further embodiments, the gate electrode material 32 can be any metal layer or metal silicide layer, e.g., TiN, TaN, Tungsten Silicide, Titanium Silicide or Cobalt Silicide.

Figure 10:
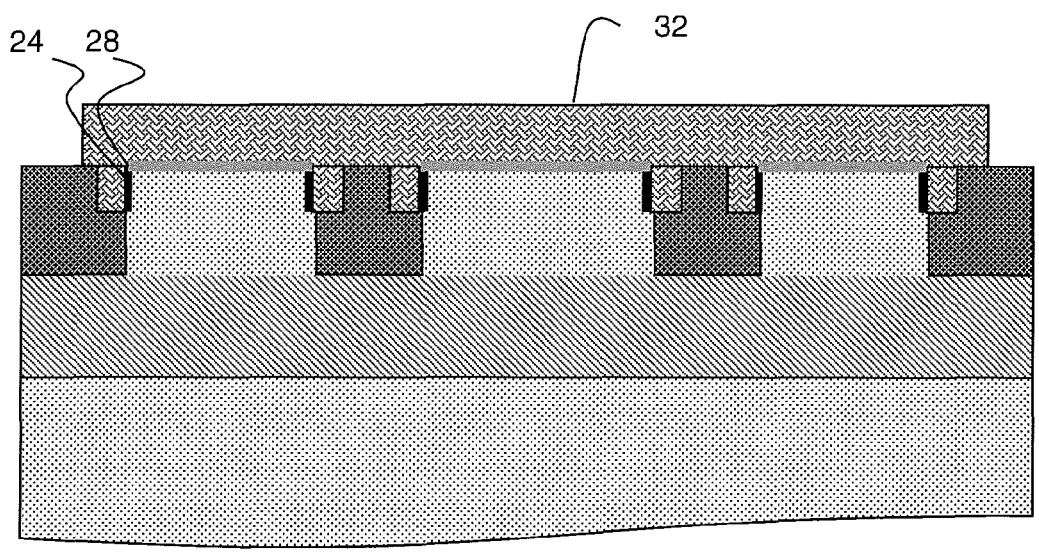
FIG. 10 represents a final structure and respective processes for fabricating the device in accordance with the invention.

As shown in FIG. 10, in embodiments, the gate electrode material 32 is patterned to cover the high-leakage dielectric 24 and the low-leakage dielectric 28, and, in embodiments, extend over portions of the STI structures 20. The gate electrode material 32 is patterned using conventional processes, e.g., lithography and etching, to form the structure shown in FIG. 10.

Although not explicitly shown in FIG. 10, those of skill in the art should understand that FIG. 10 also represents a complete FET fabrication process using conventional processes. For example, FIG. 10 should be understood to include the following structures and respective processes/formations: sidewall spacer formation, extension/halo ion implantation, second spacer formation, deep source/drain implantation, annealing to form a silicide and back end of the line (BEOL) processes such as, for example, contacts and interconnects.

The invention further contemplates a design methodology wherein a desired history effect is arrived at by segmenting a given width FET into multiple narrow-width FETs. Accordingly, a given total width, W, can be segmented into n segments (n=1, 2 ... et cetera) electrically connected in parallel, each segment of width given approximately by W/n, until the desired value of history effect is achieved. More-negative history values are achieved by larger values of n and more-positive values of history are achieved by smaller values of n.

Design Structure

Figure 11:
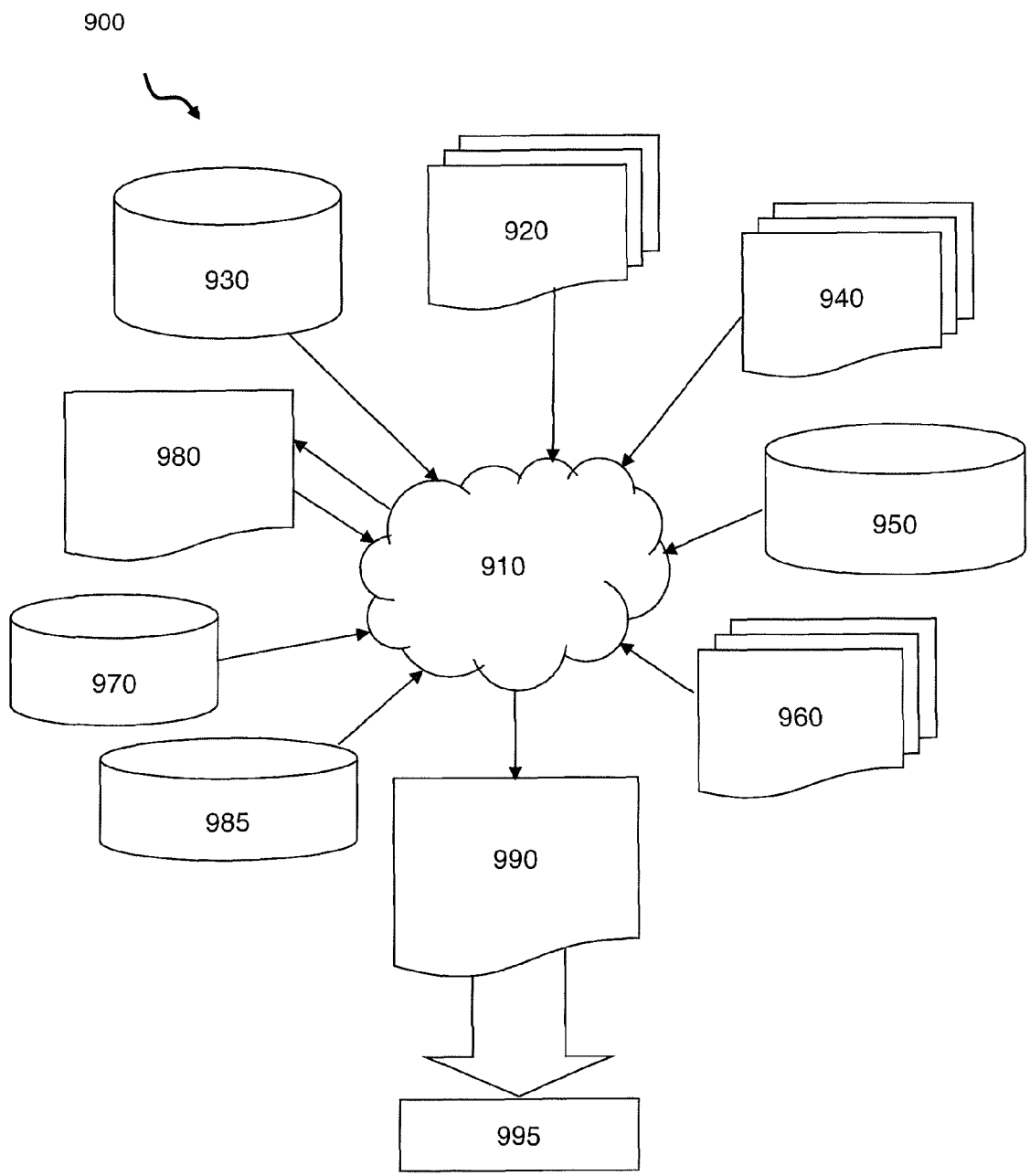
FIG. 11 is a flow diagram of a design process used in semiconductor design, manufacture, and/or test.

FIG. 11 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 8 and/or 10 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 8 and/or 10. Design process 910 preferably synthesizes (or translates) an embodiment of the invention as shown in FIGS. 8 and/or 10 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 8 and/or 10, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 8 and/or 10. Design structure 990 may then proceed to a stage 995 where, for example, design structure 990: proceeds to tape-out, is released to manufacturing, is released to a mask house, is sent to another design house, is sent back to the customer, etc.

The structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A process for manufacturing an integrated circuit, the process comprising:
    translating inputs into a design structure embodied in a machine readable storage medium in a data format used for the exchange of layout data of integrated circuits and/or symbolic data format; and fabricating the integrated circuit defined by the design structure having manufacturing data, wherein the integrated circuit includes:
    a high-leakage dielectric on each of sides of a segmented field effect transistor (FET) comprised of active silicon islands and gate electrodes thereon; and
    a low-leakage dielectric on and in contact with a top surface of the active silicon islands, adjacent the high-leakage dielectric, a top surface of the high-leakage dielectric being at a coplanar level as the top surface of the active silicon islands; and
    a gate electrode material is within a divot of a shallow trench isolation material and is in direct contact with and between a portion of the shallow trench isolation material and the high-leakage dielectric, wherein the high-leakage dielectric is within the divot and on a side surface of the active silicon islands, wherein:
    the high-leakage dielectric, the low-leakage dielectric, the gate electrode material, and the shallow trench isolation material are completely above a buried oxide (BOX) layer;
    the gate electrodes are directly in contact with the shallow trench isolation material; and
    top surfaces of the gate electrode material and the shallow trench isolation material are formed at the coplanar level as the top surfaces of the high-leakage dielectric and the active silicon islands.

2. The process of claim 1, wherein the design structure comprises a netlist.

3. The process of claim 1, wherein the design structure resides in a programmable gate array.

4. The process of claim 1, wherein:
    the high-leakage dielectric is a low-k dielectric material; and
    the low-leakage dielectric is a high-k dielectric material.

5. The process of claim 1, wherein the low-leakage dielectric is formed directly in contact with the high-leakage dielectric.

6. The process of claim 1, wherein:
the high-leakage dielectric is a low-k dielectric material;
the low-leakage dielectric is a high-k dielectric material; and
the low-leakage dielectric is formed directly in contact with the high-leakage dielectric.

7. The process of claim 1, wherein the segmented FET is a floating FET.

8. The process of claim 1, wherein the high-leakage dielectric is at least one of a silicon dioxide and a silicon oxynitride.

9. The process of claim 1, wherein the high-leakage dielectric ranges in thickness of between approximately 0.7 to 2 nanometers.

10. The process of claim 1, wherein a number of segments of the segmented FET is a predetermined number selected to achieve a desired value of history effect.

11. The process of claim 1, wherein the gate electrode material is in direct contact with a sidewall and a bottom surface of the shallow trench isolation material within the divot.

12. The process of claim 11, wherein the gate electrodes extend over a plurality of shallow trench isolation materials.

13. The process of claim 12, wherein the high-leakage dielectric is in direct contact with the active silicon islands and the gate electrode material.

* * * * *